United States Patent
Eastin

(10) Patent No.: US 7,479,614 B2
(45) Date of Patent: Jan. 20, 2009

(54) RADIO FREQUENCY IDENTIFICATION TAG INLAY SORTATION AND ASSEMBLY

(75) Inventor: David Eastin, Columbia, MD (US)

(73) Assignee: Symbol Technologies, Holtsville, NY (US)

( * ) Notice: Subject to any disclaimer, the term of this patent is extended or adjusted under 35 U.S.C. 154(b) by 118 days.

(21) Appl. No.: 11/033,542

(22) Filed: Jan. 12, 2005

(65) Prior Publication Data

US 2005/0155213 A1   Jul. 21, 2005

Related U.S. Application Data

(60) Provisional application No. 60/535,489, filed on Jan. 12, 2004.

(51) Int. Cl.
B07C 5/344 (2006.01)
(52) U.S. Cl. .................. 209/573; 209/571; 340/572.1
(58) Field of Classification Search .................. 209/552, 209/571, 573
See application file for complete search history.

(56) References Cited

U.S. PATENT DOCUMENTS

| | | | |
|---|---|---|---|
| 3,724,737 | A | 4/1973 | Bodnar |
| 3,891,157 | A | 6/1975 | Justus |
| 3,989,575 | A | 11/1976 | Davies et al. |
| 4,346,514 | A | 8/1982 | Makizawa et al. |
| 4,480,742 | A | 11/1984 | Muylle |
| 4,925,808 | A | 5/1990 | Richardson |
| 5,256,578 | A | 10/1993 | Corley et al. |
| 5,519,381 | A | 5/1996 | Marsh et al. |
| 5,528,222 | A | 6/1996 | Moskowitz et al. |
| 5,537,105 | A | 7/1996 | Marsh et al. |
| 5,557,280 | A | 9/1996 | Marsh et al. |
| 5,564,888 | A | 10/1996 | Doan |
| 5,566,441 | A | 10/1996 | Marsh et al. |
| 5,585,193 | A | 12/1996 | Josephy et al. |
| 5,837,349 | A | 11/1998 | Van Erden et al. |
| 5,904,546 | A | 5/1999 | Wood et al. |
| 5,946,198 | A | 8/1999 | Hoppe et al. |
| 5,966,903 | A | 10/1999 | Dudderar et al. |

(Continued)

FOREIGN PATENT DOCUMENTS

DE    196 34 473 C2    1/1998

(Continued)

OTHER PUBLICATIONS

English Language Abstract for DE 19634473, published Jan. 22, 1998, 1 page.

(Continued)

Primary Examiner—Patrick H Mackey
Assistant Examiner—Mark Hageman

(57) ABSTRACT

A method, system, and apparatus for a radio frequency identification (RFID) tag inlay tester and sorter system are described. A tag inlay is received. A characteristic of the tag inlay is tested. The tag inlay is disposed if the tag inlay is determined to fail the test of characteristic. The tag inlay is transported to a processing station if the tag inlay is determined to have passed the test of characteristic. The tag inlay is processed at the processing station. In an aspect, the tag inlay testing and tag inlay processing is performed in a single apparatus. In an alternative aspect, the tag inlay testing is performed by a first apparatus, and the tag inlay processing is performed by a second apparatus.

13 Claims, 8 Drawing Sheets

U.S. PATENT DOCUMENTS

| | | | |
|---|---|---|---|
| 5,982,284 | A | 11/1999 | Baldwin et al. |
| 6,018,299 | A | 1/2000 | Eberhardt |
| 6,082,660 | A | 7/2000 | Meyer |
| 6,091,332 | A | 7/2000 | Eberhardt et al. |
| 6,104,291 | A * | 8/2000 | Beauvillier et al. ...... 340/572.1 |
| 6,145,901 | A | 11/2000 | Rich |
| 6,147,662 | A | 11/2000 | Grabau et al. |
| 6,165,386 | A | 12/2000 | Endo et al. |
| 6,206,292 | B1 | 3/2001 | Robertz et al. |
| 6,237,217 | B1 * | 5/2001 | Bohn et al. ................... 29/806 |
| 6,262,692 | B1 | 7/2001 | Babb |
| 6,265,977 | B1 | 7/2001 | Vega et al. |
| 6,281,795 | B1 | 8/2001 | Smith et al. |
| 6,322,903 | B1 | 11/2001 | Siniaguine et al. |
| 6,416,608 | B1 | 7/2002 | Mynott et al. |
| 6,437,271 | B1 | 8/2002 | Beffa |
| 6,451,154 | B1 * | 9/2002 | Grabau et al. ............... 156/300 |
| 6,514,790 | B1 | 2/2003 | Plettner et al. |
| 6,555,400 | B2 | 4/2003 | Farnworth et al. |
| 6,606,247 | B2 | 8/2003 | Credelle et al. |
| 6,608,370 | B1 | 8/2003 | Chen et al. |
| 6,692,978 | B2 | 2/2004 | Tandy et al. |
| 6,731,353 | B1 | 5/2004 | Credelle et al. |
| 7,073,713 | B2 * | 7/2006 | Silverbrook et al. ... 235/462.01 |
| 7,187,293 | B2 * | 3/2007 | White et al. ............. 340/572.8 |
| 2002/0050591 | A1 | 5/2002 | Tandy |
| 2002/0053735 | A1 | 5/2002 | Neuhaus et al. |
| 2002/0189981 | A1 | 12/2002 | Beffa |
| 2003/0063001 | A1 | 4/2003 | Hohberger et al. |
| 2003/0136503 | A1 | 7/2003 | Green et al. |
| 2004/0192011 | A1 | 9/2004 | Roesner |
| 2005/0026315 | A1 | 2/2005 | Cowles et al. |
| 2005/0176170 | A1 | 8/2005 | Detig |

FOREIGN PATENT DOCUMENTS

| | | | |
|---|---|---|---|
| DE | 198 46 295 | A1 | 4/1999 |
| DE | 198 05 031 | C2 | 8/1999 |
| DE | 198 40 226 | A1 | 3/2000 |
| FR | 2 775 533 | | 9/1999 |
| WO | WO 00/14733 | A1 | 3/2000 |
| WO | WO 00/28339 | | 5/2000 |
| WO | WO 01/54058 | A1 | 7/2001 |
| WO | WO 01/61646 | A1 | 8/2001 |
| WO | WO 01/95241 | A1 | 12/2001 |
| WO | WO 02/37414 | A1 | 5/2002 |
| WO | WO 02/49093 | A1 | 6/2002 |
| WO | WO 02/082368 | A1 | 10/2002 |

OTHER PUBLICATIONS

English Language Abstract for DE 19805031, published Aug. 19, 1999, 1 page.

English Language Abstract for DE 19840226, published Mar. 16, 2000, 1 page.

English Language Abstract for FR 2775533, published Sep. 3, 1999, 1 page.

Sarma, Sanjay, "White Paper-Towards the 5¢ Tag", Auto-ID Center, Published Nov. 1, 2001, pp. 1-19.

Lewis, Steve "Basic introduction to RFID Technology and its use in the Supply Chain," Jan. 2004, Laran RIFD, Web Site: WWW.larandrfid.com, Date Downloaded: Dec. 13, 2005.

International Search Report issued Mar. 12, 2007 for Application No. PCT/US05/00818, 8 pages.

U.S. Appl. No. 11/266,208, filed Nov. 4, 2005, Addison et al., "Method and System for High Volume Transfer of Dies to Substrates".

European Patent Office. Supplementary European Search Report dated May 28, 2008. European Application No. 05 70 5463.7-2210. Applicant's Name: Symbol Technologies, Inc. 3 pages.

* cited by examiner

RADIO FREQUENCY IDENTIFICATION TAG INLAY SORTATION AND ASSEMBLY

This application claims the benefit of U.S. Provisional Application No. 60/535,489, filed Jan. 12, 2004, which is incorporated herein by reference in its entirety.

BACKGROUND OF THE INVENTION

1. Field of the Invention

The present invention relates to circuit assembly and test, and more particularly to high volume sortation of radio frequency identification (RFID) tags.

2. Background Art

An RFID tag may be affixed to an item whose presence is to be detected and/or monitored. The presence of an RFID tag, and therefore the presence of the item to which the tag is affixed, may be checked and monitored by devices known as "readers."

Currently, RFID tags are assembled and then laminated to the face sheet of a pressure sensitive laminate. Once laminated, the backside of the RFID tag is coated with an adhesive, and a release liner is applied. After the release liner is applied, the tag is printed and/or die cut into the desired form factor.

A tag can be tested for proper operation either before the lamination process, after the lamination process, or both before and after. Testing before or after the lamination process is difficult when the tags are in a web format, where tags are formed in an array of tags, typically in a roll. If the tags are tested while in the roll, any bad tags (e.g., non-functional, malfunctioned) in the roll have to be removed from the roll, and replaced with good (e.g., functional) tags. The procedure of removing bad tags from a web, replacing them in the web with good tags, tends to be expensive and time consuming.

Thus, methods, systems, and apparatuses are needed for assembly of tags in high volume webs, while allowing for testing of the tags, and for removal and replacement of any bad tags.

BRIEF SUMMARY OF THE INVENTION

Methods, systems, and apparatuses for a radio frequency identification (RFID) tag inlay tester and sorter are described.

In an embodiment of the present invention, a method for sorting tag antennas in a sortation system is provided. A tag inlay is received. At least one characteristic of the tag inlay is tested. The tag inlay is disposed if the tag inlay is determined to fail the test of characteristic. The tag inlay is transported to a processing station if the tag inlay is determined to have passed the test of characteristic. The tag inlay is processed at the processing station.

In an embodiment, the tag inlay testing and tag inlay processing is performed in a single apparatus. In another embodiment, the tag inlay testing is performed by a first apparatus, and the tag inlay processing is performed by a second apparatus.

In another embodiment of the present invention, a radio frequency identification (RFID) tag sortation system is provided. A transport mechanism receives a tag inlay from a tag inlay dispenser and transports the tag inlay. A tag inlay tester tests at least one characteristic of the tag inlay when the tag inlay is transported to a test station. A web station dispenses a web of pressure sensitive adhesive material. The web station processes the tag inlay when the tag inlay is transported to the web station and if the tag inlay is determined to have passed the test of the characteristic. The tag inlay is processed by placing the tag inlay on a position on the web at the web station. The web is advanced to present a subsequent position on the web for a next tag. A reject station disposes of the tag inlay when the tag inlay is transported to the reject station and if the tag inlay is determined to have failed the test of the characteristic.

In an example embodiment, an infeed magazine contains a stack of assembled tags (e.g., antennas and dies). A tag carrier receives a tag from the infeed magazine. A testing station receives the tag from the tag carrier and tests the received tag. The tested tag can then be packaged and subsequently transferred/sold, or can be further processed prior to being transferred/sold. For example, the tested tag can have one or more further layers attached, such as a pressure sensitive adhesive material, a release liner, etc.

A plurality of web stations each dispense a continuous web of pressure sensitive adhesive material. A particular web station of the plurality of web stations receives the tested tag from the tag carrier if the tag is determined by the testing device to be not defective, and is determined to meet the test criteria for the particular web station. The tag received by the particular web station is placed on a position on the web of the particular web station. The web is advanced to present a subsequent position on the web for a next tag. A reject station receives the tag if the tag is determined to be defective by the testing device.

These and other advantages and features will become readily apparent in view of the following detailed description of the invention. Note that the Summary and Abstract sections may set forth one or more, but not all exemplary embodiments of the present invention as contemplated by the inventor(s), and thus, are not intended to limit claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
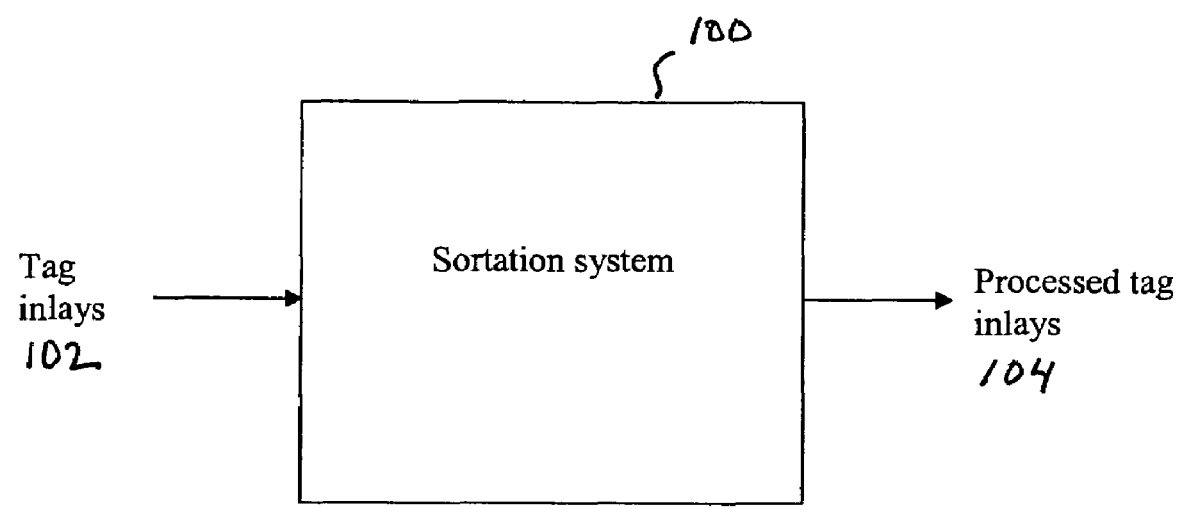
FIGS. 1-4 show block diagrams of example inlay sortation systems, according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present invention allows for the performance of quality checks on RFID devices, including ultra-high frequency (UHF) tag inlays, the removal of any tag inlays not operating properly, and the placement of properly operating tags into a usable format for application.

For example, a web (e.g., roll) format is a commonly used format for supplying tags to users. A large number of tag inlays can be supplied to a user in a single roll. Using traditional techniques, a web of tag inlays may be produced having a large proportion of bad tag inlays. Thus, effort must be expended in removing the bad tags from the roll, and replacing them with good tags. Embodiments of the present invention overcome this problem, producing rolls of tag inlays where substantially all the tag inlays are tested as operational prior to insertion into the roll.

An expensive step in the process of manufacturing a RFID tag is testing and converting the tag into a form factor that can be seamlessly integrated into an end user's process. Embodiments of the present invention reduce costs in testing and converting tags into a useful form factor.

In embodiments, RFID tags inlays (singulated or in roll format) are received from an assembly machine, and are each tested for proper operation and/or read rate quality. If received in a roll format, the tag inlays are singulated (i.e., physically separated into individual tag inlays). After the singulated tags are tested, the tested tags can be stored in a tag container, which can be sold or supplied to a user for use of the tags. In another embodiment, the singulated tags can be sorted by a test criteria, and placed into one or more containers based on the test criteria. The containers can be sold or supplied to a user for use of the tags.

In still another embodiment, the tested tags can be placed on a pressure sensitive adhesive web, such as in a roll format. For example, the tested tags can be sorted based on a test criteria, and placed into one or more rolls of pre-printed/coated, patterned, pressure sensitive adhesive. The rolls can be easily assimilated into a user's packaging line for dispense onto the user's package, carton, product or skid.

The invention allows for high-speed testing of each individual tag because each tag under test can be isolated (i.e., singulated). The tags can be graded according to a test performance criteria, and placed into a desired form factor with high reliability. The invention also provides the end user with any desired format for application to an object, package, etc.

RFID Antenna Sorter/Applicator (RASA) Embodiments

Example RFID tag sortation systems according to embodiments of the present invention, are described below. These embodiments are described for illustrative purposes, and are not intended to be limiting. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Note that the discussion herein generally relates to the sortation of "tag inlays." A "tag inlay" or "inlay" is defined as an assembled RFID device that generally includes a integrated circuit chip and antenna formed on a substrate. However, the discussion herein is also intended to encompass other forms of RFID devices, including "tags" and "labels".

A "tag" is generally defined as a tag inlay that has been attached to another surface, or between surfaces, such as paper, cardboard, etc., for attachment to an object to be tracked, such as an article of clothing, etc.

A "label" is generally defined as an inlay that has been attached to a pressure sensitive adhesive (PSA) construction, or laminated then cut and stacked for application through in-mould, wet glue or heat seal application processes, for example. A variety of label types are contemplated by the present invention. In an embodiment, a label includes an inlay attached to a release liner by pressure sensitive adhesive. The release liner may be coated with a low-to-non-stick material, such as silicone, so that it adheres to the pressure sensitive adhesive, but may be easily removed (e.g., by peeling away). After removing the release liner, the label may be attached to a surface of an object, or placed in the object, adhering to the object by the pressure sensitive adhesive. In an embodiment, a label may include a "face sheet", which is a layer of paper, a lamination, and/or other material, attached to a surface of the inlay opposite the surface to which the pressure sensitive material attaches. The face sheet may have variable information printed thereon, including product identification regarding the object to which the label is attached, etc.

Embodiments of the present invention allow the use of a variety of adhesive materials, including cold temp adhesives, pharmaceutical adhesives, freezer adhesive, removable adhesives, high-tech adhesives (e.g., for sticking to tires), and other adhesive material types.

FIGS. 1-4 show block diagrams of example inlay sortation systems, according to embodiments of the present invention. As shown in FIG. 1, a sortation system 100 receives one or more tag inlays 102, and outputs one or more processed tag inlays 104. Sortation system 100 sorts received tag inlays 102. For example, in an embodiment, sortation system 100 tests tag inlays 102 to determine whether they are operating properly. For instance, sortation system 100 may test tag inlays 102 to determine whether they respond to interrogation by a reader. Thus, sortation system 100 may sort tag inlays 102 into two groups: (1) properly operating or functioning tag inlays (e.g., properly respond to an interrogation), and (2) not properly operating of functioning tag inlays (e.g., do not respond properly to an interrogation). In an embodiment, sortation system 100 may further sort tag inlays 102 into two or more groups, according to a characteristic, such as the quality of the operation or functionality of tag inlays 102. For example, sortation system 100 may sort tag inlays 102 according to a distance over which the tag inlays 102 are capable of responding. For instance, sortation system 100 may sort tag inlays 102 into two groups: (1) tag inlays that respond at a distance up to 20 feet, and (2) tag inlays that respond at a distance greater than 20 feet.

Tag inlays 102 may be sorted by sortation system 100 in a variety of ways. For example, tag inlays 102 can be sorted by any test criteria, such as the operational or functional characteristics describe above, including power of response, response error rate, or in any other manner. Tag inlays 102 can also be sorted by physical characteristics, such as physical dimensions of the tag inlay, quality or dimensions of antenna patterns/traces (e.g., thickness of metal deposited), or in any other manner. Furthermore, sortation system 100 can sort tags inlays 102 by any combination of test criteria. Example embodiments for testing of tag inlays by sortation system 100 are described below.

Sortation system 100 may also further process tested tag inlays 102. For example, sortation system 100 may collect tag inlays which failed testing for disposal or recycling. Sortation system 100 may also package accepted tag inlays for distribution, or to prepare for further processing. Example embodiments for further processing of tag inlays by sortation system 100 are described below.

Sortation system 100 outputs processed tag inlays 104 in a user-friendly format. For example, processed tag inlays 104 can be output in a web (e.g., roll) format. Alternatively, processed tag inlays 104 can be output in a singulated format, such as in a container of singulated devices.

Sortation system 100 can include a system for controlling/coordinating one or more functions of sortation system 100, including a testing of tag inlays, a tracking of tag inlays in sortation system 100, and a controlling of the processing of tag inlays 104. For example, sortation system 100 can include a mechanical and/or electrical control mechanism that coordinates these functions. The control mechanism (or controller) can include a processor (e.g., microprocessor, microcontroller), a computer system, other logic, and/or any other control mechanism. During operation, for instance, a controller of sortation system 100 may control a reader to test tag inlays 102. The controller may store in a memory results of the tests of tag inlays 102. The controller may store in memory the position of tag inlays in sortation system 100, and/or may track their movement through tag sortation system 100. The controller can direct a particular station of sortation system 100 to process a particular tag inlay. The controller can direct a reject station of sortation system 100 to dispose of failed tag inlays. Such a control mechanism can handle these and/or other functions of sortation system 100.

Figure 2:
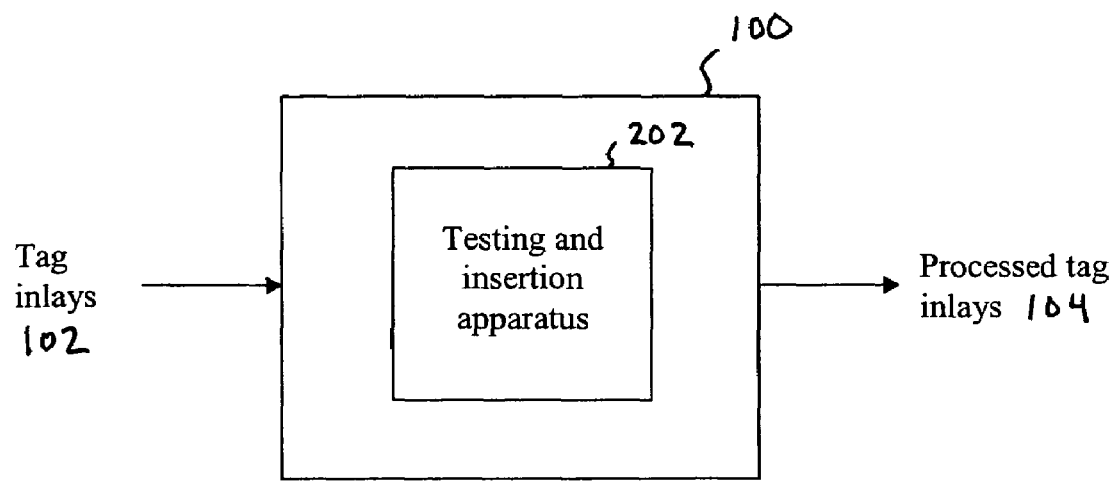

Sortation system 100 may include a single apparatus for sortation of tag inlays 102. For example, as shown in FIG. 2, sortation system 100 may include a testing and insertion apparatus 202 that tests tag inlays 102, and further processes the tag inlays for distribution, according to an embodiment of the present invention. An example such embodiment is described in further detail below.

Figure 3:
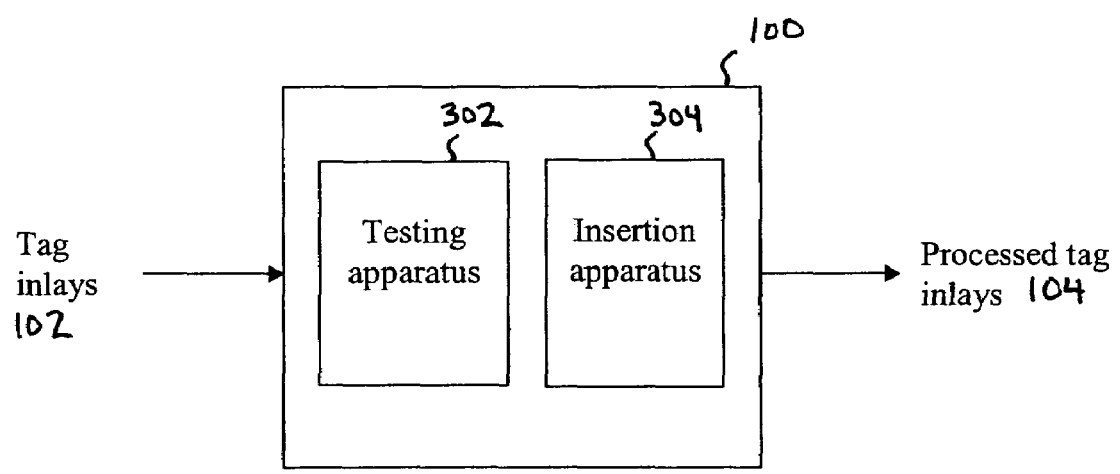

Alternatively, sortation system 100 may include multiple apparatuses for sortation of tag inlays 102. For example, as shown in FIG. 3, sortation system 100 may include a testing apparatus 302 and an insertion apparatus 304, according to an embodiment of the present invention. Testing apparatus 302 tests tag inlays 102, while insertion apparatus 304 further processes the tag inlays for distribution.

Figure 4:
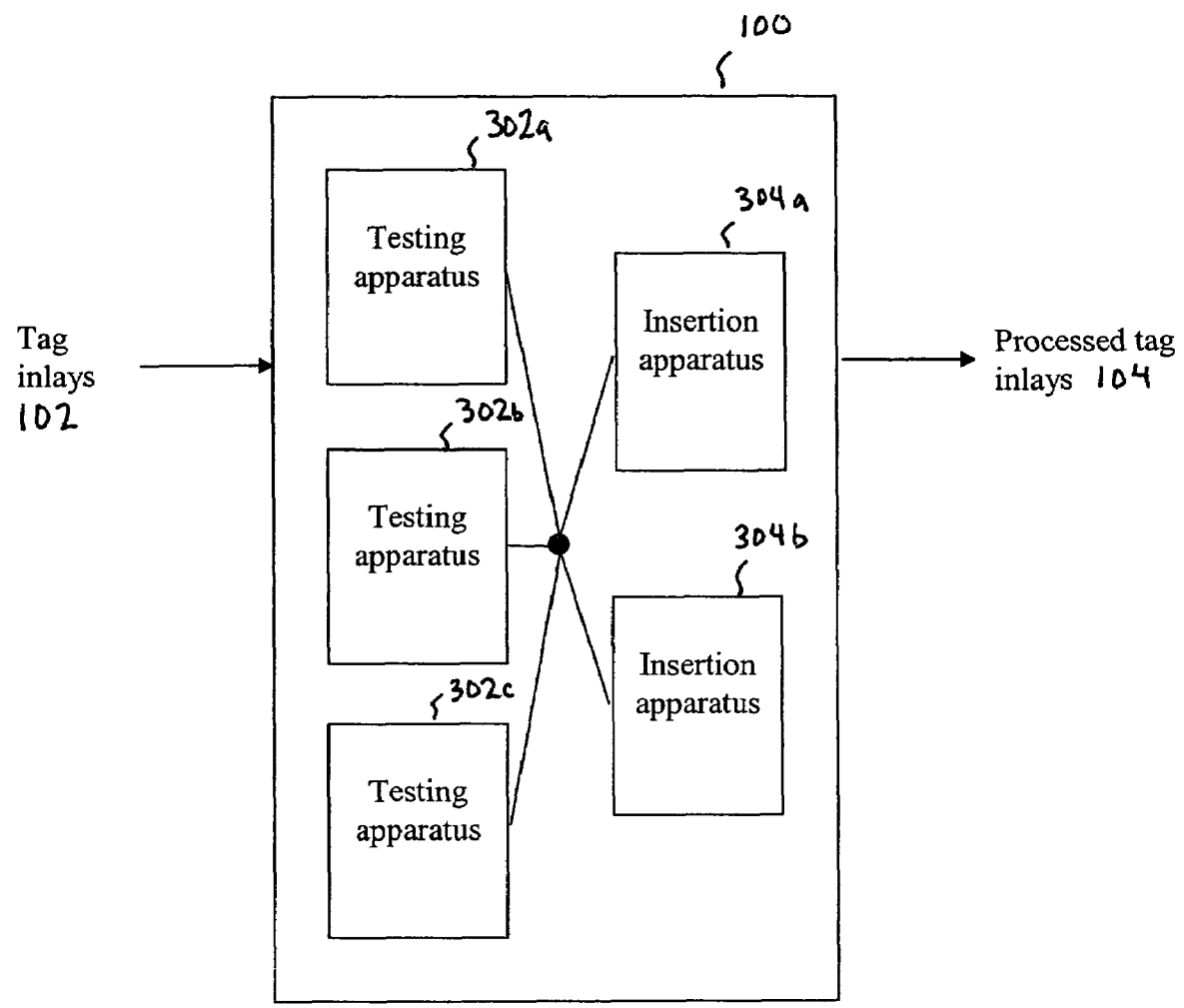

Note that in the embodiment of FIG. 3, testing apparatus 302 and insertion apparatus 304 ideally operate on tag inlays 102 at approximately the same rate. If testing apparatus 302 and insertion apparatus 304 operate on tag inlays 102 at different rates, the slower operating of testing apparatus 302 and insertion apparatus 304 will dictate the overall rate at which tag inlays are sorted. Thus, in an alternative embodiment, to provide for a faster rate of operation, a plurality of testing apparatuses 302 and/or a plurality of insertion apparatuses 304 may be present in sortation system 100. For example, if testing apparatus 302 operates on tag inlays 102 at a slower rate than insertion apparatus 304, multiple testing apparatuses 302 can be operated in parallel to increase the rate of testing of tag inlays. For instance, FIG. 4 shows an example sortation system 100, which includes first, second, and third testing apparatuses 302a-c, and first and second insertion apparatuses 304a and 304b, according to an embodiment of the present invention. In this example, testing apparatuses 302a-c each operate on tags inlays at approximately ⅔ of the rate at which insertion apparatuses 304a and 304b each operate on tag inlays. Any number of testing apparatuses 302 and of insertion apparatuses 304 may be present in a sortation system, depending on the particular application.

Example Inlay Test System Embodiments

Figure 5:
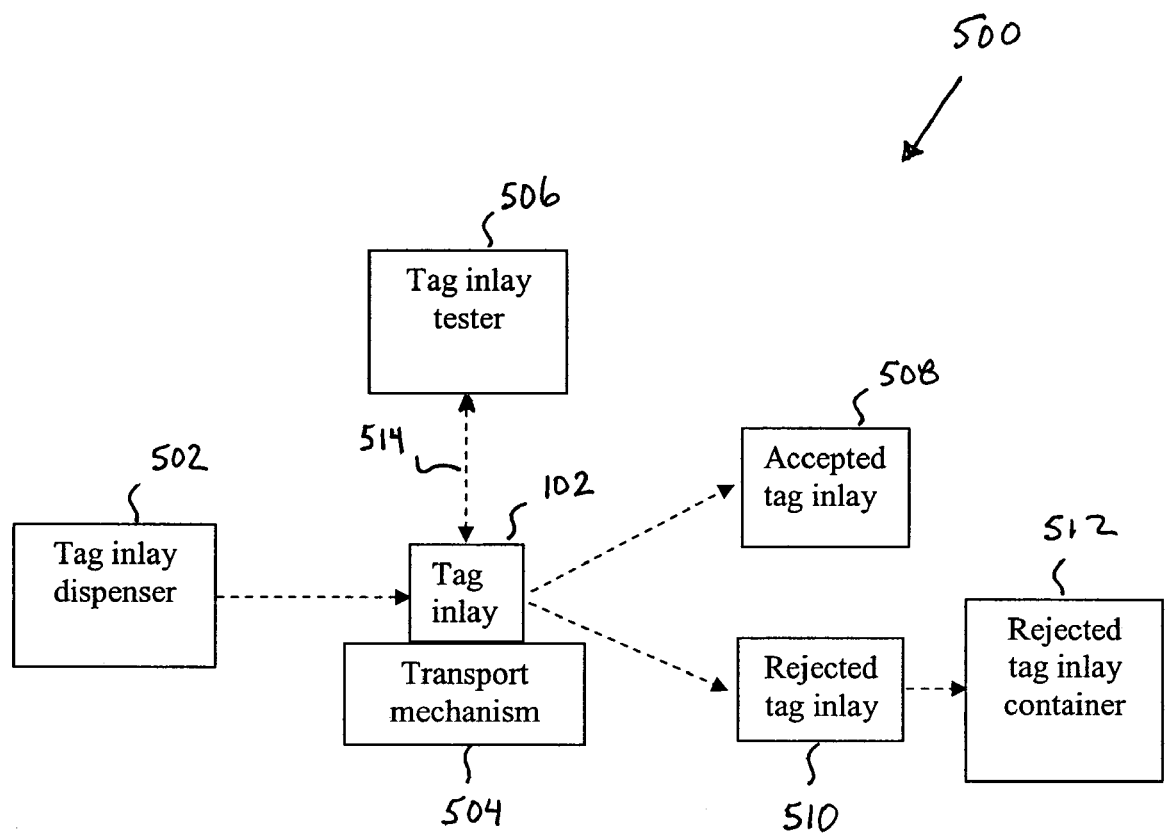
FIGS. 5-7 show block diagrams of example inlay test configurations, according to embodiments of the present invention.
Figure 6:
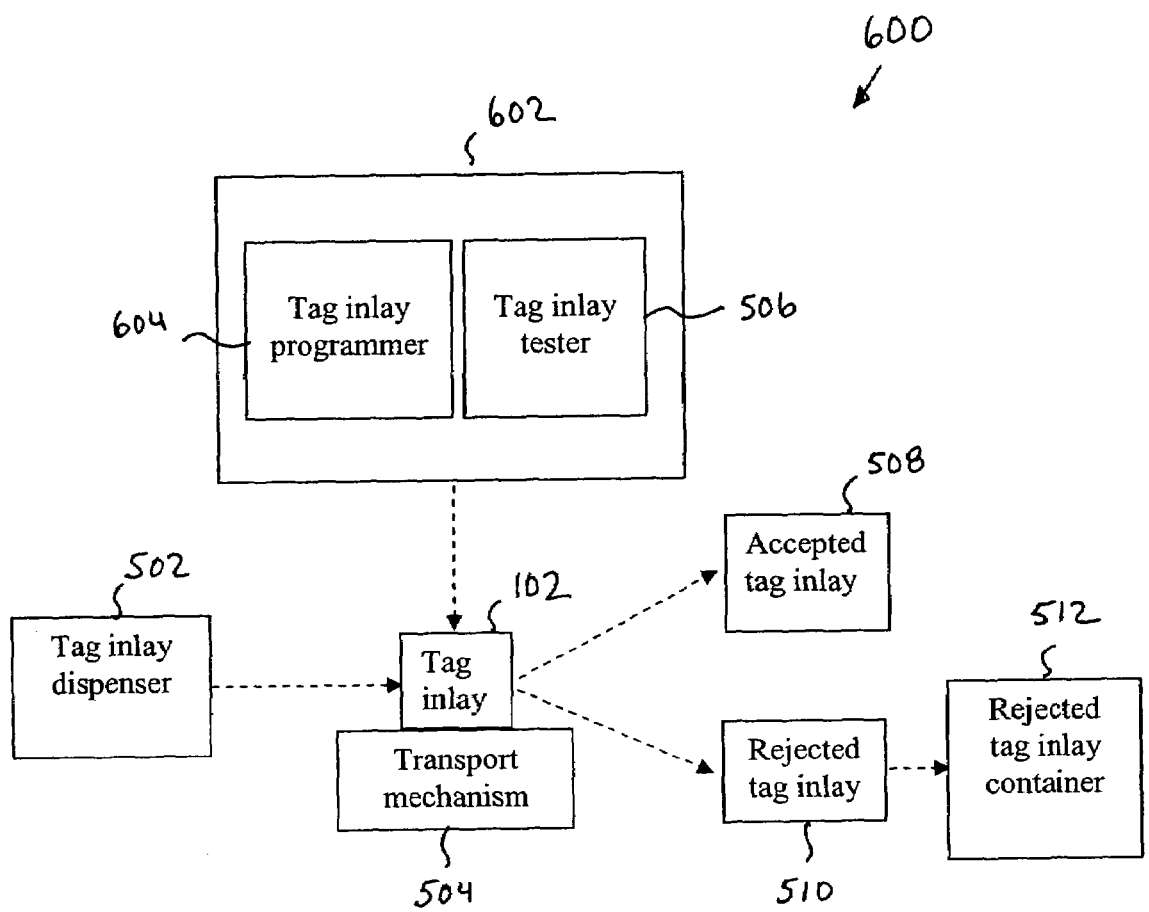

FIGS. 5 and 6 show block diagrams of example inlay test configurations, according to embodiments of the present invention. For example, in embodiments, the configurations shown in FIGS. 5 and 6 can be implemented in testing and insertion apparatus 202 or testing apparatus 302.

FIG. 5 shows an example testing system 500, which includes a tag inlay dispenser 502, a transport mechanism 504, a tag inlay tester 506, and a rejected tag inlay container 512. Although not shown in FIG. 5, testing system 500 may include a control mechanism, such as described in the prior section, to control/coordinate some or all of its functions.

Tag inlay dispenser 502 is a container or magazine which contains a plurality of tag inlays 102 to be tested. The tag inlays 102 may be individually stacked or otherwise arranged in tag inlay dispenser 502. Note that in an embodiment, tag inlays 102 may alternatively be received or contained by tag inlay dispenser 502 in a roll format. In such an embodiment, tag inlay dispenser 502 may include a singulation mechanism, for singulating tag inlays 102 from the roll prior to dispensing tag inlays 102.

Tag inlays 102 are received by a transport mechanism 504 from tag inlay dispenser 502. For example, transport mechanism 504 may include a vacuum head to pick up and place tag inlays, a mechanical mount, and/or any other mechanism for receiving tag inlays. As shown in FIG. 5, transport mechanism 504 mounts a tag inlay 102. Furthermore, transport mechanism 504 may be used to transport tag inlay 102 to a test station of system 500, and to further stations when present. For example, transport mechanism 504 may include a rotary device (e.g., when stations are arranged in a circle), a conveyor belt (e.g., when stations are arranged linearly), a pick and place apparatus, or other mechanism for transporting tag inlays from location to location, as needed.

As shown in FIG. 5, transport mechanism 504 positions tag inlay 102 in a location (e.g., a testing station) where tag inlay tester 506 can interact with tag inlay 102 for test. In an embodiment, the test station may include one or more Faraday cages, or other shielded enclosures, with corresponding testers (e.g., readers) for isolating and testing one or more tag inlays.

In an embodiment, tag inlay tester 506 interacts with tag inlay 102 over communication link 514. For example, tag inlay tester 506 can include a reader that wirelessly interrogates tag inlay 102 according to a RFID communication protocol compatible with tag inlay 102. For instance, tag inlay tester 506 may attempt to read an identification number stored in tag inlay 102, to determine whether tag inlay 102 is operating properly. For example, tag inlay tester 506 can implement a near field read (e.g., using a closely located coil) or a far field read (e.g., using an antenna). The present invention is applicable to RFID devices communicating according to any RFID communication protocol. Exemplary applicable RFID communication protocols/RFID tag inlay types include EPC (Electronic Product Code)–compliant Class 0 (read-only), Class 0+ (write extension for Class 0), and Class 1 (read/write-once), and Gen 2.

Furthermore, tag inlay tester 506 may interact with tag inlay 102 to test a quality of the operation of tag inlay 102, in order to sort tag inlay 102. For example, tag inlay tester 506 may interact with tag inlay 102 over communication link 514 to test a read distance, an error rate, etc., related to tag inlay 102.

If tag inlay 102 is found to operate properly, transport mechanism 504 may convey tag inlay 102 (as accepted tag inlay 508) to a subsequent station. For example, transport mechanism 504 may convey tag inlay 102 to a particular station based on a quality of its operation. If tag inlay 102 is found to not operate properly (e.g., is damaged, malfunctioning, or operating out of a desired operational range), transport mechanism 504 may convey tag inlay 102 (as rejected tag inlay 510) to rejected tag inlay container 512, which may be located at a reject station of system 500. Alternatively, rejected tag inlay 510 could be marked, so that rejected tag inlay 510 can be later located for disposal or recycling.

FIG. 6 shows an example testing system 600, which is generally similar to system 500 of FIG. 5. However, system 600 includes a program and test station 602, which includes a tag inlay programmer 604 and tag inlay tester 506, according to an embodiment of the present invention. Thus, tag inlay programmer 604 is present to program tag inlay 102. Tag inlay programmer 604 can program tag inlay 102 to store an identification number and/or other data in tag inlay 102, which can be tested by tag inlay tester 506 to verify proper operation of tag inlay 102. For example, data programmed into tag inlay 102 can include an identification number, data used for test purposes, customer data, and/or any other data.

Note that after test of tag inlays 102, some or all data in the tested tag inlays can be cleared from tag inlay memory by program and test station 602, if desired.

In embodiments, tag inlay programmer 604 and tag inlay tester 506 can be separate devices, or can be the same device (e.g., a reader).

Note that when an increased length of time is required to program tag inlays, a number of tag inlay testing stations versus a number of tag inlay processing stations can be increased (such as described with respect to FIG. 4 above). Alternatively, program and test station 602 can be configured to handle multiple tag inlays in parallel.

Thus, as described above, system 500 and system 600 can each be implemented in an apparatus separate from an apparatus that performs further tag inlay processing. Alternatively, systems 500 and 600 can each be present in an apparatus that performs both tag inlay testing and further tag inlay processing (such as testing and insertion apparatus 202 described above). Example embodiments for systems and apparatuses that perform further tag inlay processing are described in the following subsection.

Figure 7:
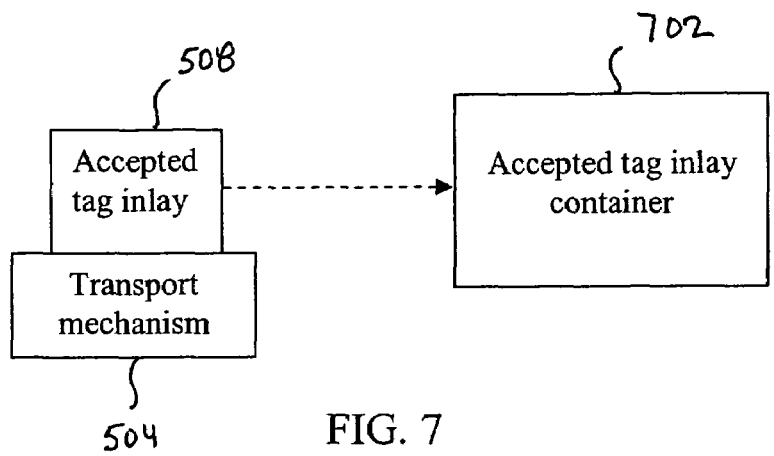

In an embodiment where system 500 or system 600 is a separate apparatus from a subsequent apparatus for further tag inlay processing, accepted tag inlays 508 may be placed in one or more containers, for transport to the subsequent apparatus for further tag inlay processing. Thus, as shown in FIG. 7, for example, system 500 or system 600 may include one or more accepted tag inlay containers 702 located at respective stations of system 500 or system 600. Once filled, the one or more containers 702 can be used to transport accepted tag inlays 508 to one or more further processing stations in the subsequent apparatus. Containers 702 may be manually transported (e.g., carried by an operator) or transported in an automated fashion to the subsequent apparatus. Alternatively, containers 702 may be used to transfer the accepted tag inlays to another entity. For example, container 702 can be sold and/or supplied to an entity such as a tag inlay distributor or tag inlay user, to supply the entity with properly operating tag inlays. In an embodiment, accepted tag inlays 508 that have been sorted by a test criteria can be distributed among a plurality of containers 702 based on the test criteria. The containers 702 can be further processed, or sold and/or supplied to an entity based on the test criteria.

Example Inlay Processing Embodiments

Figure 8:
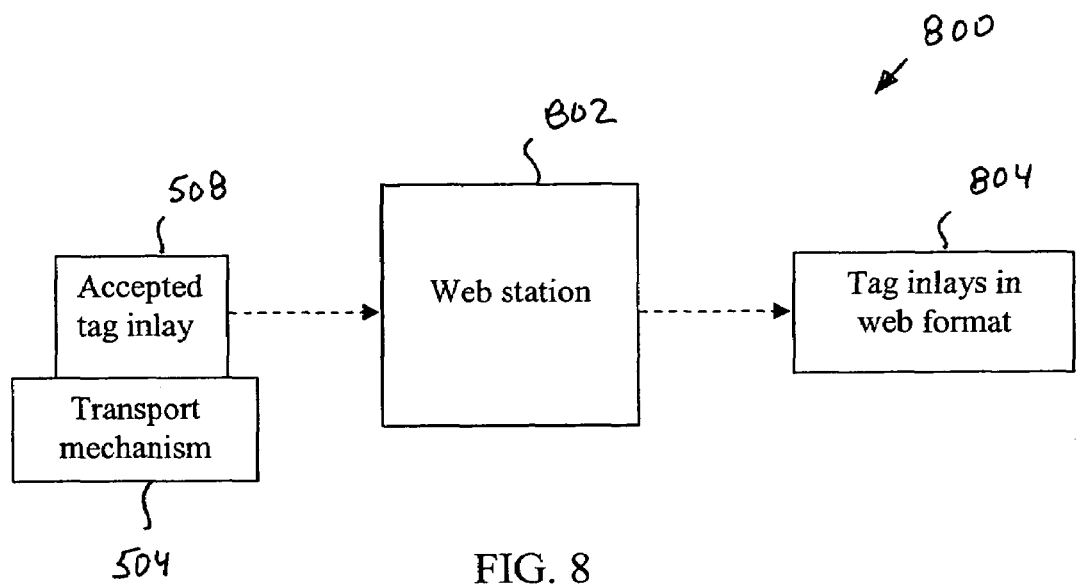
FIGS. 8 and 9 show block diagrams of example inlay processing configurations, according to embodiments of the present invention.
Figure 9:
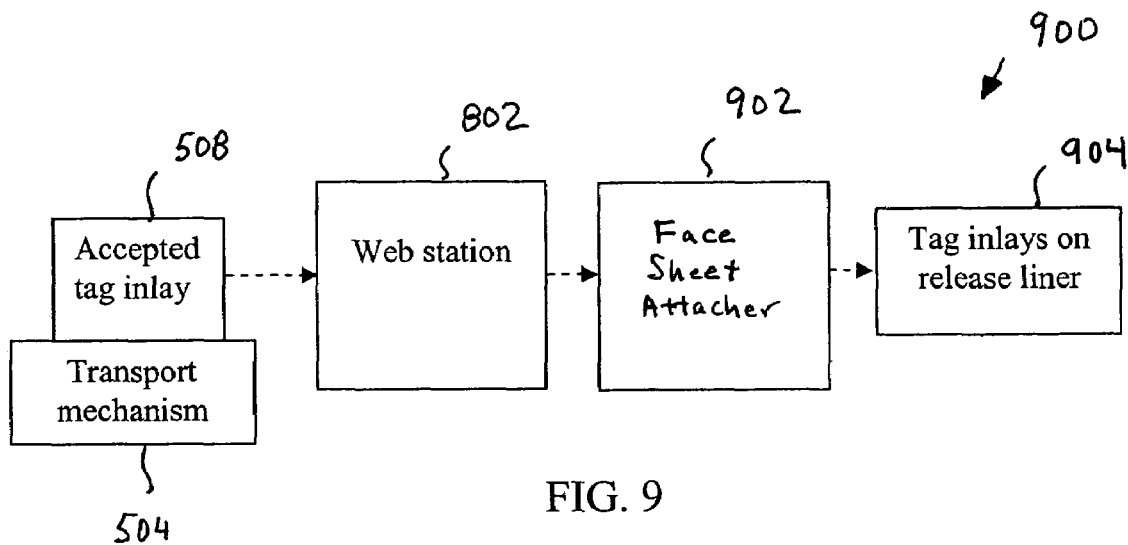

FIGS. 8 and 9 show block diagrams of example inlay processing configurations, according to embodiments of the present invention. For example, in embodiments, the configurations shown in FIGS. 8 and 9 can be implemented in testing and insertion apparatus 202 or insertion apparatus 304, described above.

FIG. 8 shows a tag processing system 800, according to an embodiment of the present invention. Although not shown in FIG. 8, tag processing system 800 may include a control mechanism, such as described above, to control/coordinate some or all of its functions. The control mechanism may the same as or different from a control mechanism of a testing system, such as may be present in testing systems 500, 600, and 700 described above.

As shown in FIG. 8, system 800 includes a web station 802. Accepted tag inlays 508 can be placed onto pressure sensitive adhesive (PSA) stock, also referred to as a "web," at web station 802, such as in a roll format. For example, web station 802 may output tag inlays in web format 804, such as a roll of RFID tag "labels." The tag inlays in web format 804 can be sold and/or supplied to another entity, to supply the entity with properly operating labels. The rolls (or sheets) can be easily assimilated into a user's packaging line for dispense onto the user's package, carton, product, skid, etc.

Note that in embodiments, tag inlays are properly oriented when being inserted into the PSA label stock. In embodiments, the orientation of tag inlays 102 is controlled upon input to tag inlay dispenser 502, so that tag inlays 102 are properly oriented when input to sortation system 100, and remain properly oriented throughout the sortation process.

In an embodiment where accepted tag inlays 508 have been sorted based on a test criteria, a plurality of web stations 802 may be present, each having a sheet or roll of PSA material for placement of corresponding accepted tag inlays 508.

FIG. 9 shows a tag processing system 900, according to an embodiment of the present invention. As shown in FIG. 9, system 900 is generally similar to system 800, but includes a face sheet attacher 902. Thus, after attaching tag inlays 102 to a PSA material, a face sheet may be attached by face sheet attacher 902 to create labels having a face sheet. Thus, a face sheet can be incorporated in labels, having variable information printed thereon, including product information.

Note that after processing of tag inlays (e.g., storing tested tag inlays in containers, attaching PSA material, attaching face sheet, etc.), it may be desired to re-test the tag inlays/labels. Thus, in an embodiment, after a tag inlay is processed, transport mechanism 504 may convey the tag inlay to another test station (or the same test station as before) for further testing.

Thus, as described above, systems 800 and 900 can each be implemented in an apparatus separate from an apparatus that performs tag inlay testing (such as systems 500 and 600 described above). Alternatively, systems 500 and 600 can each be present in an apparatus that performs both tag inlay testing and further tag inlay processing (such as testing and insertion apparatus 202 described above). Example embodiments for systems and apparatuses that perform both tag inlay testing and further tag inlay processing are described in the following subsection.

Example Combined Inlay Testing and Processing Embodiments

Figure 10A:
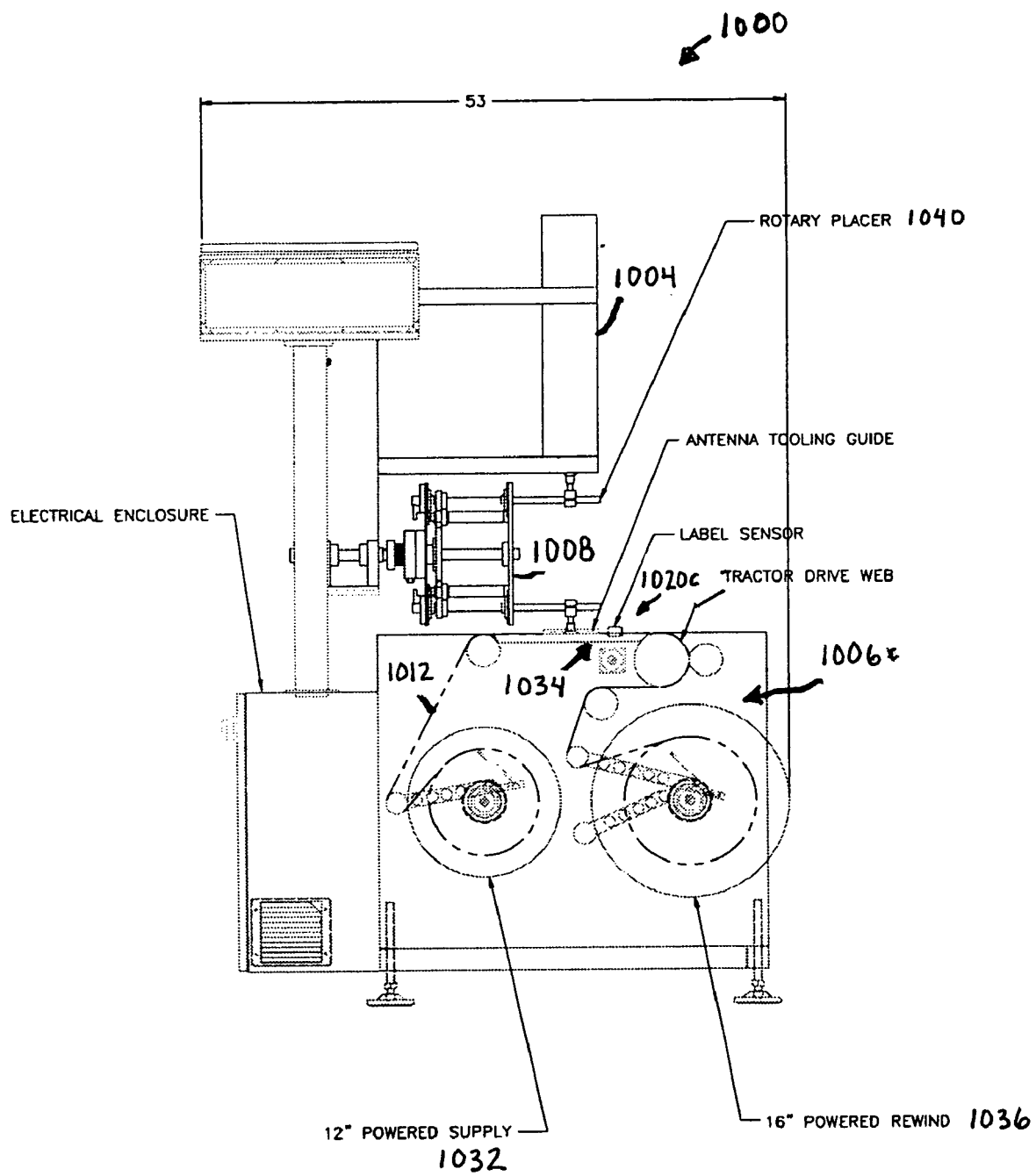
FIGS. 10A and 10B show front and side views, respectively, of an example antenna sorter and applicator, according to an embodiment of the present invention.
Figure 10B:
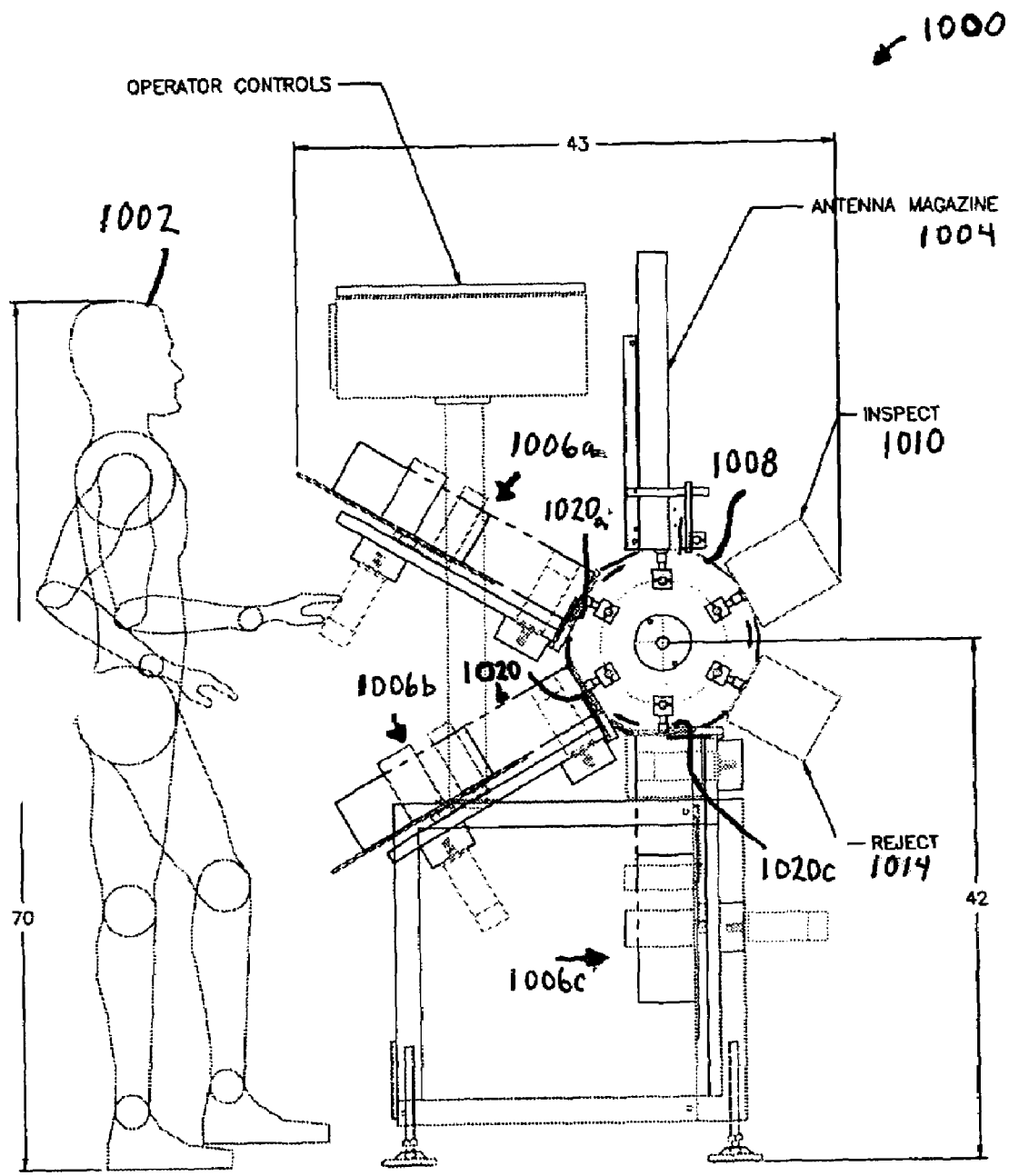

FIGS. 10A and 10B show front and side views, respectively, of an example tag inlay sorter and applicator system 1000, according to an embodiment of the present invention. For example, system 1000 is an example of testing and insertion apparatus 202, shown in FIG. 2. System 1000 tests and sorts pre-cut (e.g., singulated) RFID tag inlays and accurately applies them to a die cut adhesive region on one of three backing liners. System 1000 outputs RFID tag inlays formed into pressure sensitive labels, appropriate for dispensing with standard labeling equipment. The embodiment of FIGS. 10A and 10B enables high production speeds and precision placement of tag inlays.

System 1000 receives RFID tag antenna inlays that are pre-cut and stacked, and receives rolls of pressure sensitive adhesive on a liner. The rolls typically have pressure sensitive adhesive formed in regions (e.g., rectangular areas) on the liner, where tag inlays are to be positioned. An operator 1002 loads a plurality of tag inlays into magazine 1004. Operator 1002 loads/threads an independent roll of pressure sensitive material, web 1012, into each of three handling "heads" 1006a-c corresponding to web stations 1020a-c. In an embodiment, each roll of pressure sensitive material of web 1012 is a laminate face sheet (coated paper or film). Note that, as described below, system 1000 can have any number of one or more web stations 1020, as required by the particular implementation.

FIG. 10A shows example detail of head 1006c of web station 1020c, according to an embodiment of the present invention. As shown in FIG. 10A, a powered unwind or supply 1032 (e.g., a supply spool) continuously supplies web 1012 past a tag inlay placement area 1034, to a powered takeup or rewind 1036 (e.g., a takeup spool) for web 1012 (with tag inlays attached thereto).

A tag inlay carrier transports tag inlays between the various stations. For example, an orbital rotary device 1008 removes one tag inlay at a time from infeed magazine 1004, and in succession presents the tag inlay to an inspection or testing station 1010, web stations 1020a-c, and to a reject station 1014. In an embodiment, a vacuum is used to pick up and place tag inlays. For example, in the embodiment of FIGS. 10A and 10B, orbital rotary device 1008 may have six vacuum heads (e.g., each on a rotary placer, such as rotary placer 1040 shown in FIG. 10A) for holding six tag inlays. In such an embodiment, at any particular moment, a vacuum head removes a tag inlay from infeed magazine 1004, another vacuum head presents a tag inlay to testing station 1010, another vacuum head presents a tag inlay to web station 1020a, another vacuum head presents a tag inlay to web station 1020b, another vacuum head presents a tag inlay to web station 1020c, and another vacuum head presents a tag inlay to reject station 1014. For each cycle of system 1000, orbital rotary device 1008 rotates 60 degrees, to move each tag inlay from one station to the next station.

Note that a particular vacuum head may or may not release a held tag inlay to a particular station, when present at the station. For example, operation of the vacuum heads may be controlled by a control mechanism of system 1000. For instance, at a particular moment, a vacuum head presents a tag inlay to web station 1020c. However, the vacuum head will not release the tag inlay to web station 1020c, unless web station 1020c is designated to process the tag inlay. If another web station (e.g., 1020a or 1020b) is designated to process the tag inlay, the vacuum head will hold the tag inlay until orbital rotary device 1008 rotates the vacuum head into position adjacent to the designated web station. Similarly, a vacuum head will not release a tag inlay to reject station 1014, even though the vacuum head is positioned adjacent to reject station 1014, unless the tag inlay is designated for rejection. Note, however, that in an embodiment, reject station 1014 may be a last station, so that all tag inlays that reach reject station 1014 are assumed to be designated for rejection. Thus, in such an embodiment, vacuum heads will always release at reject station 1014 when reached.

Note that in an alternative embodiment, instead of a circular alignment of stations, as shown in FIGS. 10A and 10B, stations can be aligned linearly. Thus, tags may be belt fed or otherwise passed between stations.

Testing station 1010 tests each received tag antenna cartridge, and returns a value that determines to which of web stations 1020a-c the tag inlay will be placed. If testing station 1010 does not return a value, the antenna cartridge will be dropped into an eject bin of reject station 1014. In an example embodiment, testing station 1010 is surrounded by a Faraday cage, to reduce radio frequency interference. System 1000 can include one or more programmable controllers to perform the testing function and/or other functions.

For example, testing station 1010 may test whether each tag inlay is operational or non-defective. If a tag inlay is determined to be defective, testing station 1010 does not return a value. If a tag inlay is determined to be not defective, testing device 1010 may use test criteria to determine how well the tag inlay operates, and returns a value corresponding to the performance level of the tag inlay, so that the tag inlay is accepted by the proper one of web stations 1020a-c. For example, testing device 1010 may determine a distance at which the tag inlay can communicate. For instance, if the tag inlay can communicate at 20 feet or greater, testing device 1010 returns a first value corresponding to web station 1020a. If the tag inlay can communicate less than 20 feet, but greater than 10 feet, testing device 1010 returns a second value corresponding to web station 1020b. If the tag inlay can communicate at less than 10 feet, testing device 1010 returns a third value corresponding to web station 1020c. Any number of web stations 1020 can be present for any number of operating ranges, etc, for tested tag inlays.

When received by one of web stations 1020a-c at which the tag inlay is designated to be placed, the corresponding adhesive web 1012 is brought into contact with the tag inlay. A vacuum can be used to hold the tag inlay to the carrier of device 1008. The vacuum precisely drops the tag inlay to gently and accurately position the tag inlay on the adhesive web 1012. Once a tag inlay is placed, the respective web handling head 1006 will advance one position to bring up a fresh pad of adhesive of the adhesive web 1012.

In an embodiment, a special guide tooling can be added to infeed magazine 1004, the antenna carrier, and each of the web station positions to improve accuracy and consistency of tag inlay handling.

System 1000 can accommodate any type or size of RFID antenna. In an embodiment, a system 1000 can be dedicated to a single antenna size. Alternatively, a system 1000 can be configured to accommodate more than one antenna size.

In embodiments, the capacity of infeed magazine 1004 is as large as possible. This may depend on the behavior of stacks of antennas, including their stability and their ability to be stripped from the bottom of a stack.

In an embodiment, tractor drive holes may be placed in the backing liner for a positive position reference and simplicity of drive design.

Thus, system 1000 outputs one or more rolls of web 1012, each roll having a plurality of tag inlays attached thereto, also called "labels". The roll(s) can subsequently be processed. For example, adhesive can be applied to a backing of a web 1012, and a "peel-off" tape can be applied to the adhesive. The web 1012 can then be separated into individual labels, which can then be applied to objects as needed. In an alternative embodiment, each web 1012 already has the peel-off tape backing attached before the tags are attached. Thus, less post-processing for such a web 1012 may be needed.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for sorting tag antenna inlays in a sortation system including a tag antenna inlay dispenser and a tag antenna inlay transport mechanism, the method comprising:
   pre-cutting a single tag antenna inlay from a roll of tag antenna inlays;
   dispensing the single tag antenna inlay from the tag antenna inlay dispenser to the tag antenna inlay transport mechanism;
   testing at least one characteristic of the single tag antenna inlay;
   disposing of the single tag antenna inlay if the tag antenna inlay is determined to fail the testing of the at least one characteristic;
   transporting the single tag antenna inlay to a selected processing station of a plurality of processing stations based on a determination that the at least one characteristic of the tag antenna inlay satisfies a test criteria for the selected processing station; and
   processing the single tag antenna inlay at the selected processing station.

2. The method of claim 1, further comprising:
   performing said dispensing, testing, disposing, transporting and processing using a first apparatus.

3. The method of claim 1, further comprising:
   performing said dispensing, testing and disposing using a first apparatus; and
   performing said processing using a second apparatus.

4. The method of claim 1, wherein the sortation system includes a testing station, and said testing comprises:
   transporting the single tag antenna inlay to the testing station; and
   testing the single tag antenna inlay at the testing station.

5. The method of claim 1, wherein said disposing comprises:
   transporting the single tag antenna inlay to a reject station if the tag antenna inlay is determined to fail said testing of the at least one characteristic.

6. The method of claim 1, wherein the sortation system includes a plurality of web stations, and said transporting comprises:
   transporting the single tag antenna inlay to a selected web station of the plurality of web stations based on a determination that the at least one characteristic of the tag antenna inlay satisfies a test criteria for the selected web station.

7. The method of claim 1, wherein said processing comprises:
   packaging the single tag antenna inlay.

8. The method of claim 1, wherein said processing comprises:
   inserting the single tag antenna inlay into an accepted tag antenna inlay container.

9. The method of claim 1, wherein said processing comprises:
   placing the single tag antenna inlay onto a position of a web of pressure sensitive adhesive material.

10. The method of claim 9, further comprising:
    transporting the web to a second processing station; and
    attaching a release liner to the web.

11. The method of claim 9, further comprising:
    advancing the web of the particular web station to present a subsequent position on the web for a next tag antenna inlay.

12. The method of claim 1, further comprising:
    storing at least one pre-cut tag antenna inlay in the tag antenna inlay dispenser.

13. The method of claim 1, further comprising:
    storing a plurality of pre-separated tag antenna inlays in the tag antenna inlay dispenser.

* * * * *